United States Patent
Hirata

(10) Patent No.: US 10,105,792 B2
(45) Date of Patent: Oct. 23, 2018

(54) SIC SUBSTRATE SEPARATING METHOD

(71) Applicant: DISCO CORPORATION, Tokyo (JP)

(72) Inventor: Kazuya Hirata, Tokyo (JP)

(73) Assignee: DISCO Corporation, Tokyo (JP)

( * ) Notice: Subject to any disclaimer, the term of this patent is extended or adjusted under 35 U.S.C. 154(b) by 5 days.

(21) Appl. No.: 15/342,583

(22) Filed: Nov. 3, 2016

(65) Prior Publication Data

US 2017/0136572 A1 May 18, 2017

(30) Foreign Application Priority Data

Nov. 12, 2015 (JP) ................................ 2015-222369

(51) Int. Cl.
| | |
|---|---|
| *B24B 49/12* | (2006.01) |
| *B23K 26/53* | (2014.01) |
| *B23K 26/00* | (2014.01) |
| *B24B 9/06* | (2006.01) |
| *H01L 21/02* | (2006.01) |
| *H01L 21/683* | (2006.01) |
| *H01L 29/16* | (2006.01) |
| *B23K 103/00* | (2006.01) |

(52) U.S. Cl.
CPC ...... *B23K 26/0057* (2013.01); *B23K 26/0006* (2013.01); *B23K 26/53* (2015.10); *B24B 9/065* (2013.01); *H01L 21/02013* (2013.01); *H01L 21/6836* (2013.01); *H01L 29/1608* (2013.01); *B23K 2203/56* (2015.10); *H01L 2221/68327* (2013.01)

(58) Field of Classification Search
CPC ..... B24B 49/12; B24B 49/10; B23K 26/0057; B23K 26/0006; B23K 26/53; B23K 2203/56
USPC ..... 451/6, 5, 41, 28, 7, 53; 125/13.01, 23.01
See application file for complete search history.

(56) References Cited

U.S. PATENT DOCUMENTS 6,992,026 B2 * 1/2006 Fukuyo .............. B23K 26/0057
438/797

FOREIGN PATENT DOCUMENTS

| JP | 2000-094221 | 4/2000 |
|---|---|---|
| JP | 2013-049161 | 3/2013 |

* cited by examiner

*Primary Examiner* — Robert Rose
(74) *Attorney, Agent, or Firm* — Greer Burns & Crain Ltd.

(57) ABSTRACT

Disclosed herein is an SiC substrate separating method for separating an SiC substrate into at least two parts in a planar manner. The SiC substrate separating method includes an adhesive tape attaching step of attaching a transparent adhesive tape to a first surface of the SiC substrate, a support member attaching step of attaching a support member to a second, opposite surface of the SiC substrate, and a separation start point forming step of setting the focal point of a laser beam at a predetermined depth from the adhesive tape and next applying the laser beam to the adhesive tape while relatively moving the focal point and the SiC substrate to thereby form a modified layer parallel to the first surface of the SiC substrate and cracks propagating from the modified layer, thus forming a separation start point.

3 Claims, 15 Drawing Sheets

SiC SUBSTRATE SEPARATING METHOD

BACKGROUND OF THE INVENTION

Field of the Invention

The present invention relates to a silicon carbide (SiC) substrate separating method for separating an SiC substrate into at least two parts in a planar manner.

Description of the Related Art

Various devices such as integrated circuits (ICs) and large scale integrations (LSIs) are formed by forming a functional layer on the front side of a wafer formed of silicon or the like and partitioning this functional layer into a plurality of regions along a plurality of crossing division lines. The division lines of the wafer are processed by a processing apparatus such as a cutting apparatus and a laser processing apparatus to thereby divide the wafer into a plurality of individual device chips corresponding to the devices. The device chips thus obtained are widely used in various electronic equipment such as mobile phones and personal computers.

Further, power devices or optical devices such as light emitting diodes (LEDs) and laser diodes (LDs) are formed by forming a functional layer on the front side of a wafer formed of a hexagonal single crystal such as SiC and GaN and partitioning this functional layer into a plurality of regions along a plurality of crossing division lines. In general, the wafer on which the devices are to be formed is produced by slicing an ingot with a wire saw. Both sides of the wafer obtained above are polished to a mirror finish (see Japanese Patent Laid-open No. 2000-94221, for example).

This wire saw is configured in such a manner that a single wire such as a piano wire having a diameter of approximately 100 µm to 300 µm is wound around many grooves formed on usually two to four guide rollers to form a plurality of cutting portions spaced in parallel with a given pitch. The wire is operated to run in one direction or opposite directions, thereby slicing the ingot into a plurality of wafers. However, when the ingot is cut by the wire saw and both sides of each wafer are polished to obtain the product, 70% to 80% of the ingot is discarded to cause a problem of poor economy. In particular, a hexagonal single crystal ingot of SiC or GaN, for example, has high Mohs hardness and it is therefore difficult to cut this ingot with the wire saw. Accordingly, considerable time is required for cutting of the ingot, causing a reduction in productivity. That is, there is a problem in efficiently producing a wafer in this prior art.

A technique for solving these problems is described in Japanese Patent Laid-open No. 2013-49161. This technique includes the steps of setting the focal point of a laser beam having a transmission wavelength to SiC inside an SiC substrate or ingot, next applying the laser beam to the SiC substrate or ingot as scanning the laser beam on the SiC substrate or ingot to thereby form a modified layer and cracks in a separation plane inside the SiC substrate or ingot, and next applying an external force to the SiC substrate or ingot to thereby break the SiC substrate or ingot along the separation plane where the modified layer and the cracks are formed, thus separating a wafer from the SiC substrate or ingot. In this technique, the laser beam (pulsed laser beam) is scanned spirally or linearly along the separation plane so that a first application point of the laser beam and a second application point of the laser beam nearest to the first application point have a predetermined positional relation with each other. As a result, the modified layer and the cracks are formed at very high density in the separation plane of the SiC substrate or ingot.

SUMMARY OF THE INVENTION

However, in the SiC substrate or ingot cutting method described in Japanese Patent Laid-open No. 2013-49161 mentioned above, the laser beam is scanned spirally or linearly on the SiC substrate or ingot. In the case of linearly scanning the laser beam, the direction of scanning of the laser beam is not specified. In the SiC substrate or ingot cutting method described in Japanese Patent Laid-open No. 2013-49161, the pitch (spacing) between the first application point and the second application point of the laser beam as mentioned above is set to 1 µm to 10 µm. This pitch corresponds to the pitch of the cracks extending from the modified layer along a c-plane defined in the SiC substrate or ingot.

In this manner, the pitch of the application points of the laser beam to be applied to the SiC substrate or ingot is very small. Accordingly, regardless of whether the laser beam is scanned spirally or linearly, the laser beam must be applied with a very small pitch and the improvement in productivity is not yet sufficient. Further, in separating a wafer from the SiC substrate or ingot along the separation plane where the modified layer and the cracks are formed, there is a problem such that the wafer may be damaged because it is relatively thin.

It is therefore an object of the present invention to provide an SiC substrate separating method which can separate an SiC substrate into at least two parts in a planar manner without causing damage.

In accordance with a first aspect of the present invention, there is provided an SiC substrate separating method for separating an SiC substrate into at least two parts in a planar manner, the SiC substrate having a first surface and a second surface opposite to the first surface, the SiC substrate separating method including an adhesive tape attaching step of attaching a transparent adhesive tape to the first surface of the SiC substrate; a support member attaching step of attaching a support member to the second surface of the SiC substrate; a separation start point forming step of setting the focal point of a laser beam having a transmission wavelength to the SiC substrate and the adhesive tape inside the SiC substrate at a predetermined depth from the adhesive tape after performing the adhesive tape attaching step and the support member attaching step, and next applying the laser beam to the adhesive tape as relatively moving the focal point and the SiC substrate to thereby form a modified layer parallel to the first surface of the SiC substrate and cracks propagating from the modified layer, thus forming a separation start point; and a separating step of applying an external force to the SiC substrate after performing the separation start point forming step, thereby separating the SiC substrate into a first SiC substrate having the first surface and a second SiC substrate having the second surface at the separation start point in the condition where the adhesive tape is attached to the first SiC substrate and the support member is attached to the second SiC substrate.

Preferably, the refractive index of the adhesive tape is higher than the refractive index of air and lower than the refractive index of the SiC substrate.

Preferably, the SiC substrate separating method further includes a flattening step of grinding a separation surface of the first SiC substrate separated from the second SiC substrate at the separation start point and also grinding a separation surface of the second SiC substrate separated from the first SiC substrate at the separation start point, by using an abrasive member, thereby flattening the separation surface of the first SiC substrate and the separation surface of the second SiC substrate.

In accordance with a second aspect of the present invention, there is provided an SiC substrate separating method for separating an SiC substrate into at least two parts in a planar manner, the SiC substrate having a first surface, a second surface opposite to the first surface, a c-axis extending from the first surface to the second surface, and a c-plane perpendicular to the c-axis, the SiC substrate separating method including an adhesive tape attaching step of attaching a transparent adhesive tape to the first surface of the SiC substrate; a support member attaching step of attaching a support member to the second surface of the SiC substrate; a separation start point forming step of setting the focal point of a laser beam having a transmission wavelength to the SiC substrate and the adhesive tape inside the SiC substrate at a predetermined depth from the adhesive tape after performing the adhesive tape attaching step and the support member attaching step, and next applying the laser beam to the adhesive tape as relatively moving the focal point and the SiC substrate to thereby form a modified layer parallel to the first surface of the SiC substrate and cracks propagating from the modified layer, thus forming a separation start point; and a separating step of applying an external force to the SiC substrate after performing the separation start point forming step, thereby separating the SiC substrate into a first SiC substrate having the first surface and a second SiC substrate having the second surface at the separation start point in the condition where the adhesive tape is attached to the first SiC substrate and the support member is attached to the second SiC substrate; the separation start point forming step including a modified layer forming step of relatively moving the focal point of the laser beam in a first direction perpendicular to a second direction where the c-axis is inclined by an off angle with respect to a normal to the first surface of the SiC substrate and the off angle is formed between the c-plane and the first surface, thereby linearly forming the modified layer extending in the first direction inside the SiC substrate, and an indexing step of relatively moving the focal point in the second direction to thereby index the focal point by a predetermined amount in the second direction.

According to the SiC substrate separating method of the first aspect of the present invention, the first surface of the SiC substrate is reinforced by the adhesive tape. Accordingly, the first SiC substrate having the first surface can be separated from the second SiC substrate having the second surface without causing damage. Further, the refractive index of the adhesive tape attached to the first surface of the SiC substrate is higher than that of air and lower than that of the SiC substrate. Accordingly, reflection of the laser beam can be suppressed by attaching the adhesive tape to the SiC substrate, so that the laser beam can be efficiently introduced into the SiC substrate.

According to the SiC substrate separating method of the second aspect of the present invention, the cracks propagate from each modified layer in opposite directions along the c-plane, so that any adjacent ones of the plural modified layers are connected with each other through the cracks. Accordingly, the SiC substrate can be efficiently separated at the separation start point. Also in the second aspect of the present invention, the first surface of the SiC substrate is reinforced by the adhesive tape, so that the first SiC substrate having the first surface can be separated from the second SiC substrate having the second surface without causing damage.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
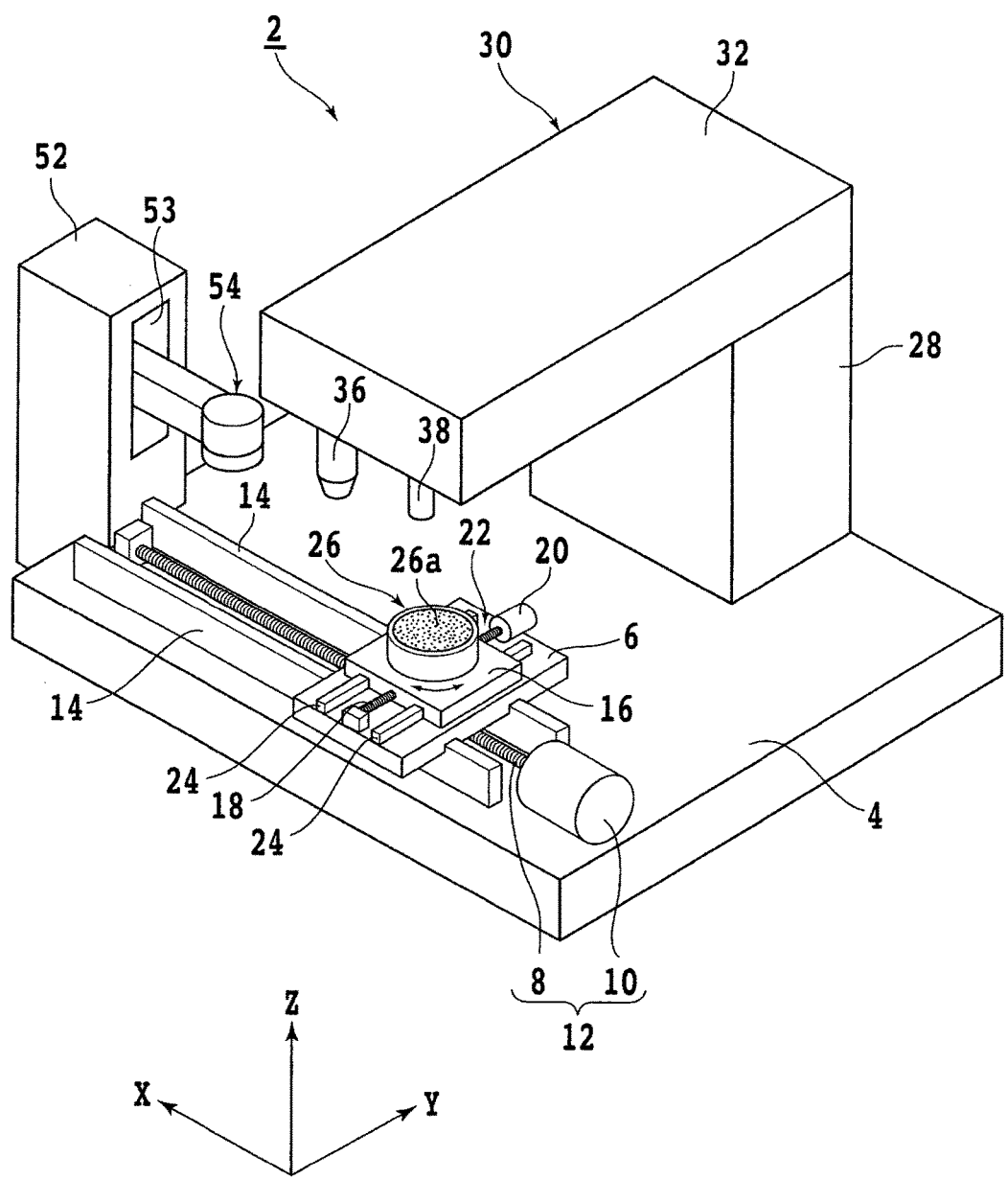
FIG. 1 is a perspective view of a laser processing apparatus suitable for use in performing an SiC substrate separating method of the present invention.

A preferred embodiment of the present invention will now be described in detail with reference to the drawings. Referring to FIG. 1, there is shown a perspective view of a laser processing apparatus 2 suitable for use in performing the SiC substrate separating method of the present invention. The laser processing apparatus 2 includes a stationary base 4 and a first slide block 6 mounted on the stationary base 4 so as to be movable in the X direction. The first slide block 6 is moved in a feeding direction, or in the X direction along a pair of guide rails 14 by a feeding mechanism 12 composed of a ball screw 8 and a pulse motor 10.

A second slide block 16 is mounted on the first slide block 6 so as to be movable in the Y direction. The second slide block 16 is moved in an indexing direction, or in the Y direction along a pair of guide rails 24 by an indexing mechanism 22 composed of a ball screw 18 and a pulse motor 20. A chuck table 26 having a suction holding portion 26a is mounted on the second slide block 16. The chuck table 26 is movable in the X direction and the Y direction by the feeding mechanism 12 and the indexing mechanism 22 and also rotatable by a motor stored in the second slide block 16.

A column 28 is provided on the stationary base 4 so as to project upward therefrom. A laser beam applying mechanism (laser beam applying means) 30 is mounted on the column 28. The laser beam applying mechanism 30 is composed of a casing 32, a laser beam generating unit 34 (see FIG. 2) stored in the casing 32, and focusing means (laser head) 36 mounted on the front end of the casing 32 so as to be movable in the Z direction. An imaging unit 38 having a microscope and a camera is also mounted on the front end of the casing 32 so as to be aligned with the focusing means 36 in the X direction.

Figure 2:
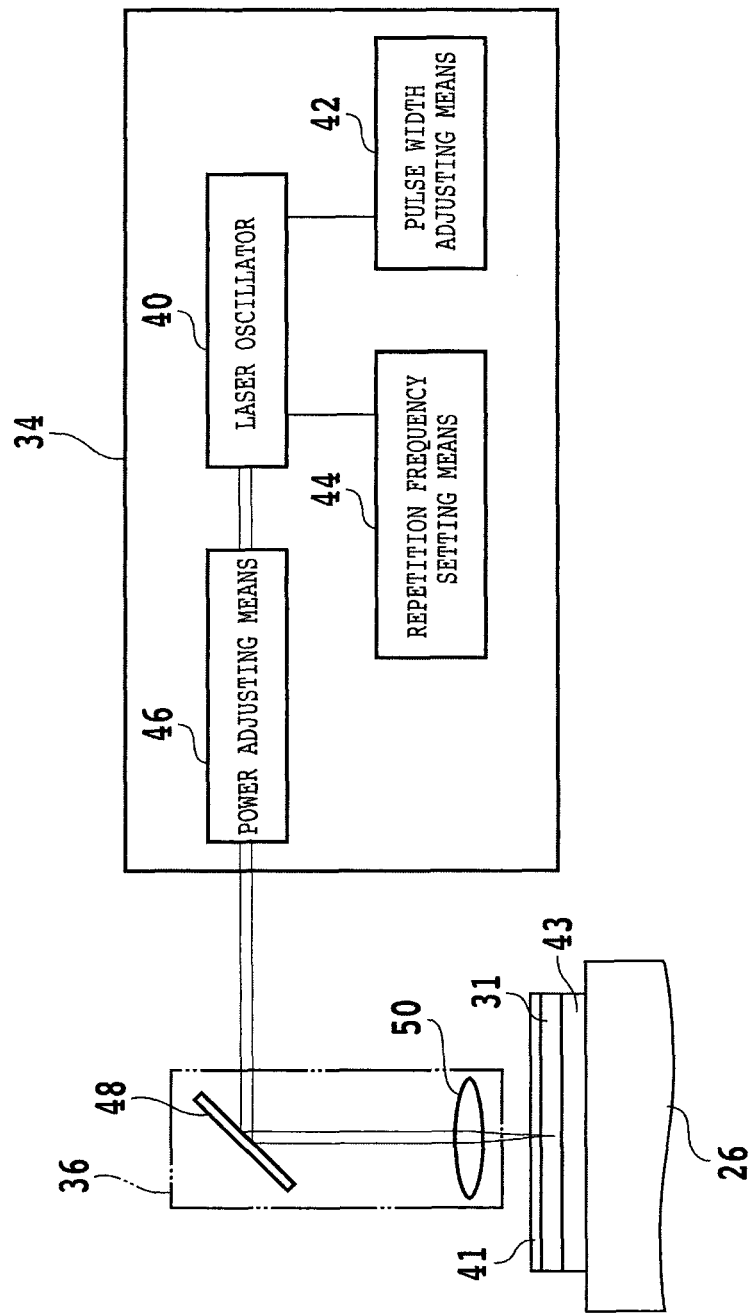
FIG. 2 is a block diagram of a laser beam generating unit included in the laser processing apparatus shown in FIG. 1.

As shown in FIG. 2, the laser beam generating unit 34 includes a laser oscillator 40 such as yttrium aluminum garnet (YAG) laser and yttrium orthovanadate (YVO4) laser for generating a pulsed laser beam, repetition frequency setting means 42 for setting the repetition frequency of the pulsed laser beam to be generated by the laser oscillator 40, pulse width adjusting means 44 for adjusting the pulse width of the pulsed laser beam to be generated by the laser oscillator 40, and power adjusting means 46 for adjusting the power of the pulsed laser beam generated by the laser oscillator 40. Although not especially shown, the laser oscillator 40 has a Brewster window, so that the laser beam generated from the laser oscillator 40 is a laser beam of linearly polarized light. After the power of the pulsed laser beam is adjusted to a predetermined power by the power adjusting means 46 of the laser beam generating unit 34, the pulsed laser beam is reflected by a mirror 48 included in the focusing means 36 and next focused by a focusing lens 50 included in the focusing means 36. The focusing lens 50 is positioned so that the pulsed laser beam is focused inside an SiC substrate 31 (to be hereinafter described) as a workpiece held on the chuck table 26.

Figure 3A:
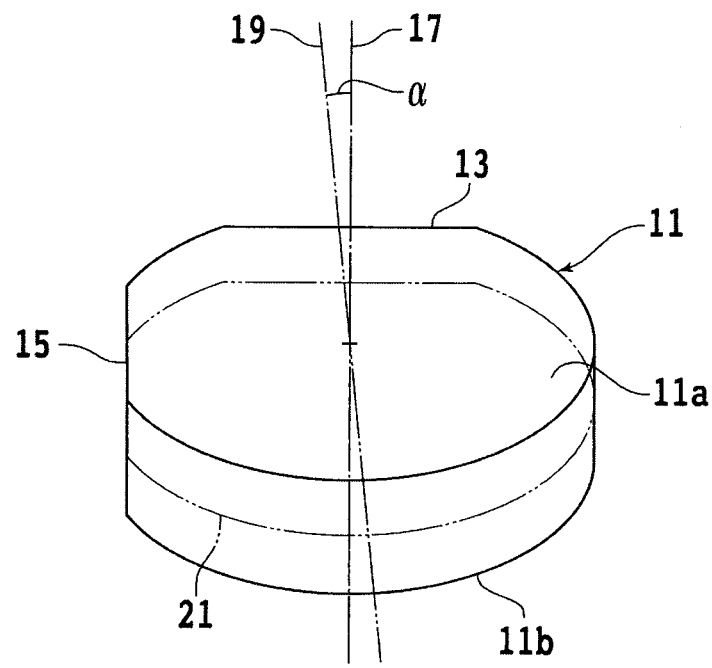
FIG. 3A is a perspective view of an SiC ingot.
Figure 3B:
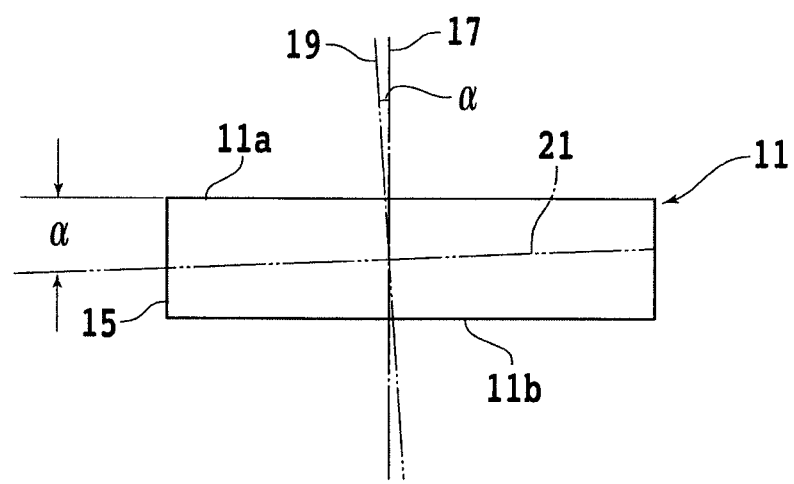
FIG. 3B is an elevational view of the SiC ingot shown in FIG. 3A.

Referring to FIG. 3A, there is shown a perspective view of an SiC ingot (which will be hereinafter referred to also simply as ingot) 11. FIG. 3B is an elevational view of the SiC ingot 11 shown in FIG. 3A. The ingot 11 has a first surface (upper surface) 11a and a second surface (lower surface) 11b opposite to the first surface 11a. The first surface 11a of the ingot 11 is preliminarily polished to a mirror finish because the laser beam is applied to the first surface 11a. The ingot 11 has a first orientation flat 13 and a second orientation flat 15 perpendicular to the first orientation flat 13. The length of the first orientation flat 13 is set longer than the length of the second orientation flat 15.

The ingot 11 has a c-axis 19 inclined by an off angle α toward the second orientation flat 15 with respect to a normal 17 to the upper surface 11a and also has a c-plane 21 perpendicular to the c-axis 19. The c-plane 21 is inclined by the off angle α with respect to the upper surface 11a. In general, in a hexagonal single crystal ingot including the SiC ingot 11, the direction perpendicular to the direction of extension of the shorter second orientation flat 15 is the direction of inclination of the c-axis 19. The c-plane 21 is set in the ingot 11 innumerably at the molecular level of the ingot 11. In this preferred embodiment, the off angle α is set to 4°. However, the off angle α is not limited to 4° in the present invention. For example, the off angle α may be freely set in the range of 1° to 6° in manufacturing the ingot 11.

Referring again to FIG. 1, a column 52 is fixed to the left side of the stationary base 4. The column 52 is formed with a vertically elongated opening 53, and a pressing mechanism 54 is vertically movably mounted to the column 52 so as to project from the opening 53.

Figure 4:
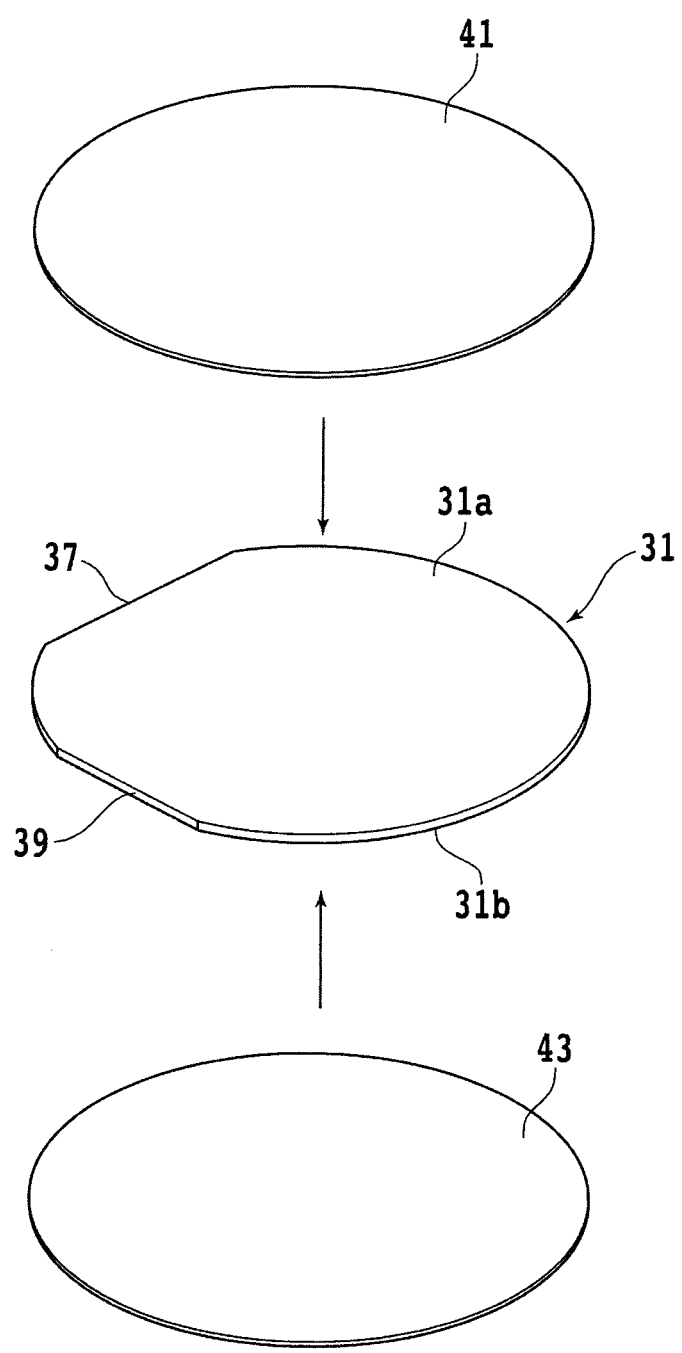
FIG. 4 is a perspective view for illustrating an adhesive tape attaching step of attaching an adhesive tape to the upper surface of an SiC substrate and a support member attaching step of attaching a support member to the lower surface of the SiC substrate.

Referring to FIG. 4, there is shown a perspective view for illustrating an adhesive tape attaching step of attaching an adhesive tape 41 to the first surface (upper surface) 31a of the SiC substrate 31 and also illustrating a support member attaching step of attaching a support member 43 to the second surface (lower surface) 31b of the SiC substrate 31. The adhesive tape 41 is transparent. For example, the adhesive tape 41 is composed of a stiff base sheet of polyethylene terephthalate (PET) or the like and an adhesive layer formed on the base sheet. The support member 43 is not necessarily transparent. For example, the support member 43 is formed from a glass substrate or a silicon wafer. The support member 43 is attached to the lower surface 31b of the SiC substrate 31 by using an adhesive. An adhesive tape may be used in place of the support member 43. The SiC substrate 31 is obtained by slicing the SiC ingot 11 shown in FIG. 3A with a wire saw. For example, the SiC substrate 31 has a thickness of approximately 700 μm.

The SiC substrate 31 has a first orientation flat 37 and a second orientation flat 39 perpendicular to the first orientation flat 37. The length of the first orientation flat 37 is set longer than the length of the second orientation flat 39. Since the SiC substrate 31 is obtained by slicing the SiC ingot 11 shown in FIG. 3A with a wire saw, the first orientation flat 37 corresponds to the first orientation flat 13 of the ingot 11, and the second orientation flat 39 corresponds to the second orientation flat 15 of the ingot 11.

The SiC substrate 31 has a c-axis 19 inclined by an off angle α toward the second orientation flat 39 with respect to a normal 17 to the upper surface 31a and also has a c-plane 21 perpendicular to the c-axis 19 (see FIG. 3B). The c-plane 21 is inclined by the off angle α with respect to the upper surface 31a of the SiC substrate 31. In the SiC substrate 31, the direction perpendicular to the direction of extension of the shorter second orientation flat 39 is the direction of inclination of the c-axis 19.

Figure 5A:
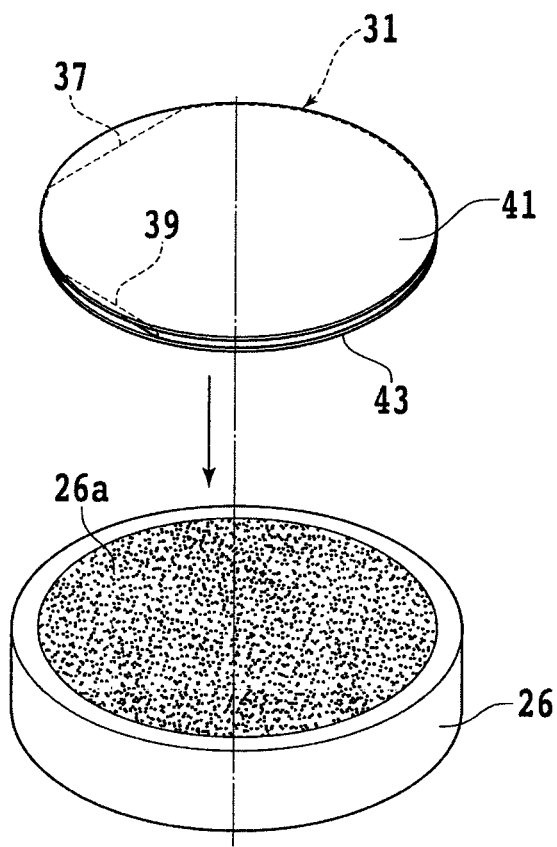
FIG. 5A is a perspective view showing a step of holding the SiC substrate through the support member on a chuck table included in the laser processing apparatus shown in FIG. 1.
Figure 5B:
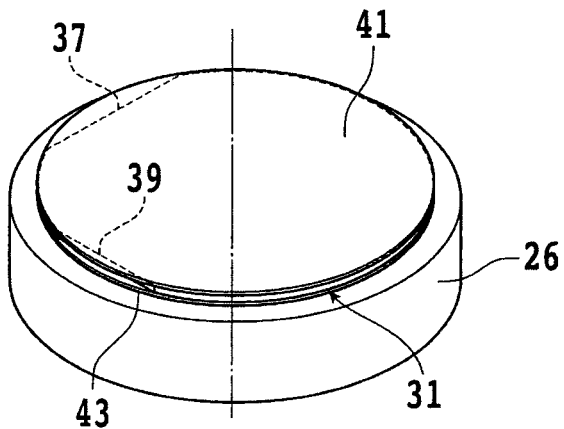
FIG. 5B is a perspective view showing a condition where the SiC substrate is held through the support member on the chuck table under suction.
Figure 6:
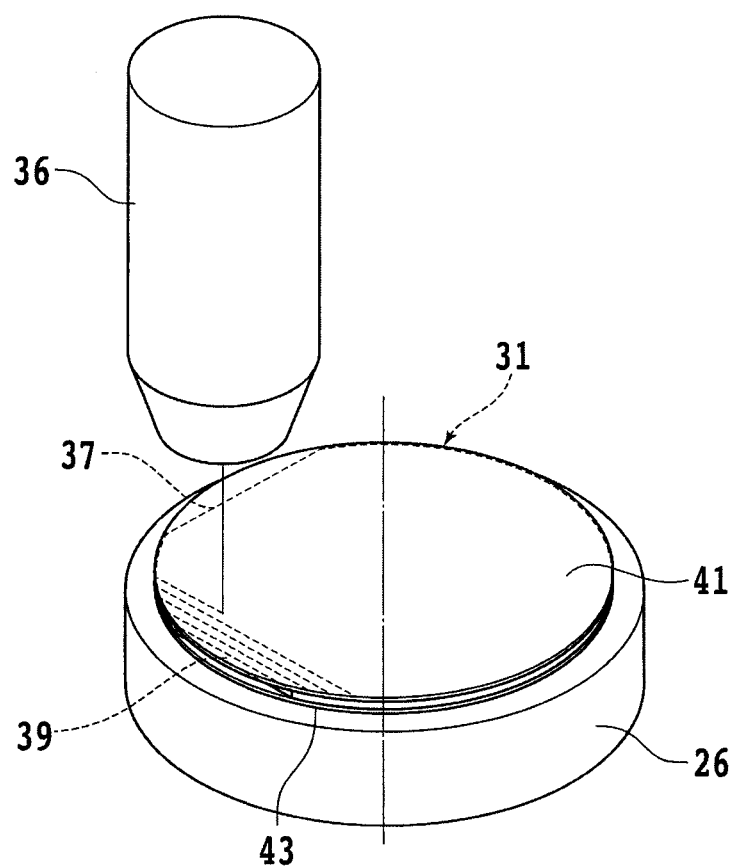
FIG. 6 is a perspective view for illustrating a separation start point forming step.

After attaching the adhesive tape 41 and the support member 43 to the SiC substrate 31, the SiC substrate 31 is placed on the chuck table 26 in the condition where the support member 43 is oriented downward as shown in FIG. 5A. Thereafter, a vacuum is applied to the suction holding portion 26a of the chuck table 26 to hold the SiC substrate 31 through the support member 43 on the chuck table 26 under suction as shown in FIG. 5B. In this condition, the adhesive tape 41 attached to the SiC substrate 31 held on the chuck table 26 is exposed. Thereafter, the chuck table 26 holding the SiC substrate 31 is rotated so that the second orientation flat 39 of the SiC substrate 31 becomes parallel to the X direction as shown in FIGS. 6 and 7.

Figure 7:
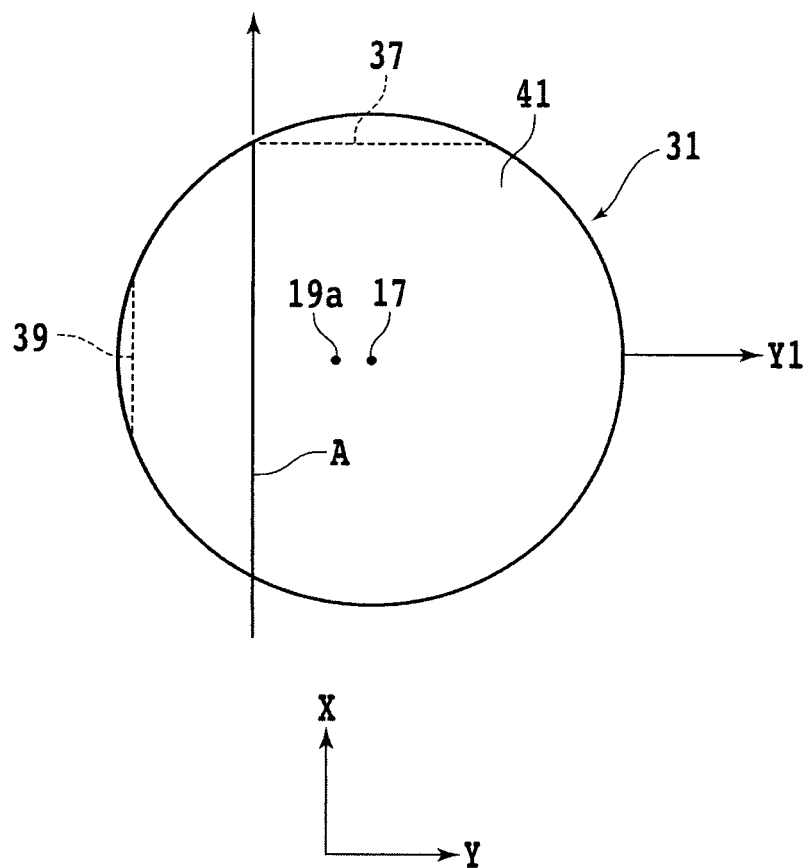
FIG. 7 is a plan view of the SiC substrate as viewed from the adhesive tape side.

In other words, as shown in FIG. 7, the direction of formation of the off angle α is shown by an arrow Y1. That is, the direction of the arrow Y1 is the direction where the intersection 19a between the c-axis 19 and the upper surface 31a of the SiC substrate 31 is present with respect to the normal 17 to the upper surface 31a. Further, the direction perpendicular to the direction of the arrow Y1 is shown by an arrow A. Then, the chuck table 26 holding the SiC substrate 31 is rotated so that the direction of the arrow A becomes parallel to the X direction, that is, the direction of the arrow A parallel to the second orientation flat 39 coincides with the X direction. Accordingly, the laser beam is scanned in the direction of the arrow A perpendicular to the direction of the arrow Y1, or perpendicular to the direction of formation of the off angle α. In other words, the direction of the arrow A perpendicular to the direction of the arrow Y1 where the off angle α is formed is defined as the feeding direction of the chuck table 26.

In the SiC substrate separating method of the present invention, it is important that the scanning direction of the laser beam to be applied from the focusing means 36 is set to the direction of the arrow A perpendicular to the direction of the arrow Y1 where the off angle α of the SiC substrate 31 is formed. That is, it was found that by setting the scanning direction of the laser beam to the direction of the arrow A as mentioned above in the SiC substrate separating method of the present invention, cracks propagating from a modified layer formed inside the SiC substrate 31 by the laser beam extend very long along the c-plane 21.

Figure 8:
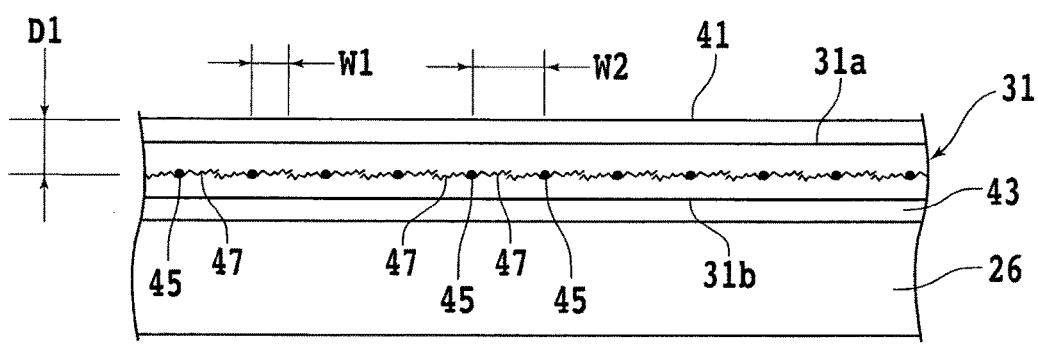
FIG. 8 is a schematic sectional view for illustrating a modified layer forming step.
Figure 8:
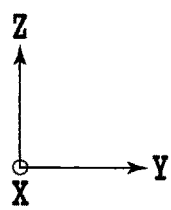

In performing the SiC substrate separating method according to this preferred embodiment, a separation start point forming step is performed in such a manner that the focal point of the laser beam having a transmission wavelength (e.g., 1064 nm) to the SiC substrate 31 and the adhesive tape 41 is set inside the SiC substrate 31 held through the support member 43 on the chuck table 26 at a predetermined depth Dl from the upper surface of the adhesive tape 41 and the laser beam is then applied to the adhesive tape 41 as relatively moving the focal point and the SiC substrate 31 to thereby form a modified layer 45 parallel to the first surface (upper surface) 31a of the SiC substrate 31 and cracks 47 propagating from the modified layer 45 along the c-plane 21, thus forming a separation start point (see FIG. 8).

Figure 9:
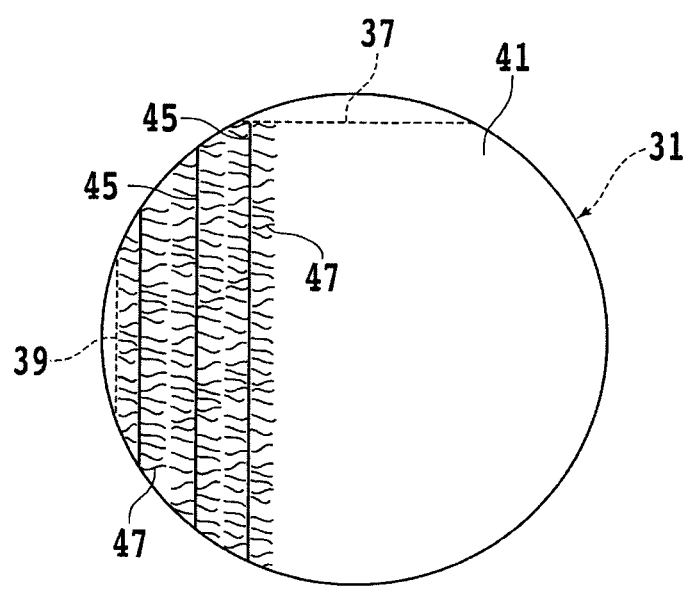
FIG. 9 is a schematic plan view for illustrating the modified layer forming step.
Figure 9:
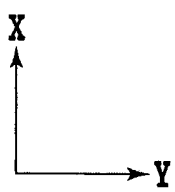

This separation start point forming step includes a modified layer forming step of relatively moving the focal point of the laser beam in the direction of the arrow A perpendicular to the direction of the arrow Y1 where the c-axis 19 is inclined by the off angle α with respect to the normal 17 to the first surface (upper surface) 31a of the SiC substrate 31 and the off angle α is formed between the c-plane 21 and the first surface (upper surface) 31a as shown in FIG. 7, thereby linearly forming the modified layer 45 inside the SiC substrate 31 and the cracks 47 propagating from the modified layer 45 along the c-plane 21 and also includes an indexing step of relatively moving the focal point in the direction of formation of the off angle α, i.e., in the Y direction to thereby index the focal point by a predetermined amount as shown in FIGS. 8 and 9.

As shown in FIGS. 8 and 9, the modified layer 45 is linearly formed so as to extend in the X direction, so that the cracks 47 propagate from the modified layer 45 in opposite directions along the c-plane 21. In the SiC substrate separating method according to this preferred embodiment, the separation start point forming step further includes an index amount setting step of measuring the width of the cracks 47 formed on one side of the modified layer 45 along the c-plane 21 and then setting the index amount of the focal point according to the width measured above. More specifically, letting W1 denote the width of the cracks 47 formed on one side of the modified layer 45 so as to propagate from the modified layer 45 along the c-plane 21, the index amount W2 of the focal point is set in the range of W1 to 2W1.

For example, the separation start point forming step is performed under the following laser processing conditions in the preferred embodiment.

Light source: Nd:YAG pulsed laser
Wavelength: 1064 nm
Repetition frequency: 80 kHz
Average power: 3.2 W
Pulse width: 4 ns
Spot diameter: 10 μm
Numerical aperture (NA) of the focusing lens: 0.45
Index amount: 400 μm In the laser processing conditions mentioned above, the width W1 of the cracks 47 propagating from the modified layer 45 along the c-plane 21 in one direction as viewed in FIG. 8 is set to approximately 250 μm, and the index amount W2 is set to 400 μm. However, the average power of the laser beam is not limited to 3.2 W. When the average power of the laser beam was set to 2 W to 4.5 W, good results were obtained.

In the case that the average power was set to 2 W, the width W1 of the cracks 47 was approximately 100 μm. In the case that the average power was set to 4.5 W, the width W1 of the cracks 47 was approximately 350 μm. In the case that the average power is less than 2 W or greater than 4.5 W, the modified layer 45 cannot be well formed inside the SiC substrate 31. Accordingly, the average power of the laser beam to be applied is preferably set in the range of 2 W to 4.5 W. For example, the average power of the laser beam to be applied to the SiC substrate 31 was set to 3.2 W in this preferred embodiment.

Figure 10:
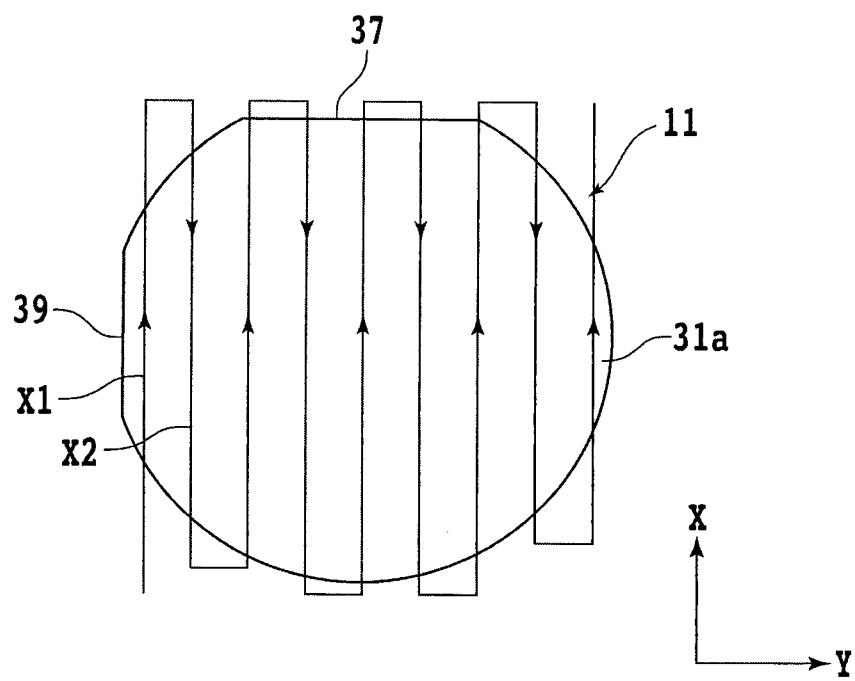
FIG. 10 is a schematic plan view for illustrating an indexing step.

Referring to FIG. 10, there is shown a schematic plan view for illustrating the scanning direction of the laser beam. The separation start point forming step is performed on a forward path X1 and a backward path X2 as shown in FIG. 10. That is, the modified layer 45 is formed in the SiC substrate 31 on the forward path X1. Thereafter, the focal point of the laser beam is indexed by the predetermined amount. Thereafter, the modified layer 45 is formed again in the SiC substrate 31 on the backward path X2.

Figure 11A:
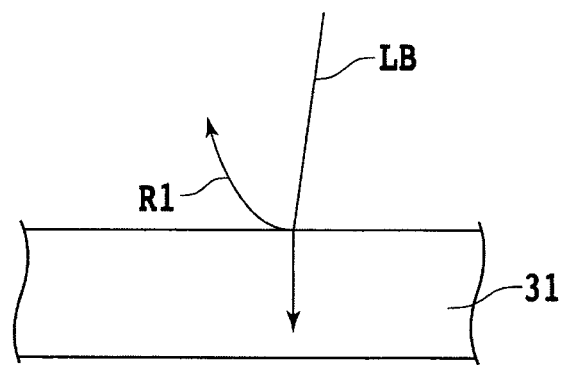
FIG. 11A is a side view for illustrating a Fresnel reflection intensity in the case that a laser beam is directly applied to the SiC substrate.
Figure 11B:
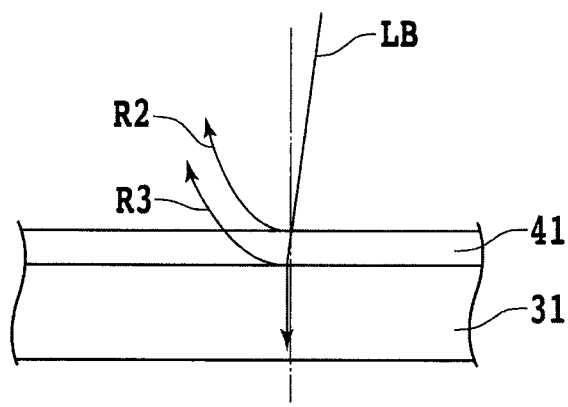
FIG. 11B is a side view for illustrating a Fresnel reflection intensity in the case that the laser beam is applied to the adhesive tape attached to the SiC substrate.

There will now be considered a Fresnel reflection intensity in the case that a laser beam LB is directly applied to the SiC substrate 31 as shown in FIG. 11A and in the case that the laser beam LB is applied to the adhesive tape 41 attached to the SiC substrate 31 as shown in FIG. 11B. Assuming that the laser beam LB enters a body B from a body A and that the refractive index of the body A is n1, the refractive index of the body B is n2, the intensity of incident light is $I_0$, and the intensity of reflected light is I, the Fresnel reflection intensity I is expressed as $I=I_0\{(n2-n1)/(n2+n1)\}^2$.

In the case shown in FIG. 11A, the body A is air and therefore n1=1, whereas the body B is the SiC substrate 31 and therefore n2=2.6. Accordingly, the intensity $I_1$ of reflected light R1 is given as $I_1=100\times\{(2.6-1)/(2.6+1)\}^2=19.8\%$. In other words, the intensity of the laser beam LB transmitted through the SiC substrate 31 is given as 100−19.8=80.2%.

On the other hand, in the case shown in FIG. 11B, which corresponds to the configuration according to the preferred embodiment of the present invention, the transparent adhesive tape 41 is attached to the upper surface 31a of the SiC substrate 31. In this case, the body A is air and therefore n1=1, whereas the body B is the adhesive tape 41 and therefore n2=1.5. In addition, a body C is the SiC substrate 31 and therefore the refractive index n3 of the body C is n3=2.6.

First, the Fresnel reflection intensity $I_2$ of reflected light $R_2$ on the upper surface of the adhesive tape 41 is given as $I_2=I_0\{(n2-n1)/(n2+n1)\}^2=100\times\{(1.5-1)/(1.5+1)\}^2=4\%$. Accordingly, the intensity of the laser beam LB transmitted through the adhesive tape 41 is given as 96%.

Next, the Fresnel reflection intensity $I_3$ of reflected light $R_3$ on the upper surface 31a of the SiC substrate 31 is given as $I_3=I_2\{(n3-n2)/(n3+n2)\}^2=96\times\{(2.6-1.5)/(2.6+1.5)\}^2=6.9\%$. Accordingly, the intensity of the laser beam transmitted through the SiC substrate 31 becomes 89.1% of the intensity of the laser beam LB applied to the adhesive tape 41.

It is apparent from the above consideration that when the transparent adhesive tape 41 is attached to the upper surface 31a of the SiC substrate 31 as shown in FIG. 11B, the intensity of the laser beam transmitted through the SiC substrate 31 is improved by 89.1−80.2=8.9% as compared with the case that the laser beam LB is directly applied to the SiC substrate 31 as shown in FIG. 11A. Thusly, when a laser beam is applied from a body M1 having a refractive index n1 through a body M2 having a refractive index n2 to a body M3 having a refractive index n3, the refractive index n2 being higher than the refractive index n1 and lower than the refractive index n3, the intensity of the laser beam transmitted through the body M3 is improved as compared with the case that the laser beam is directly applied from the body M1 to the body M3 largely different in refractive index from the body M1.

Figure 12A:
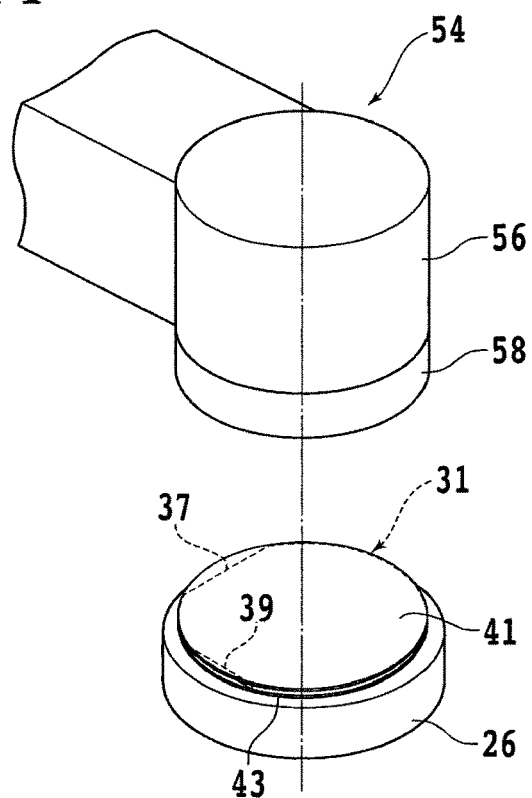
FIGS. 12A and 12B are perspective views for illustrating a separating step.
Figure 12B:
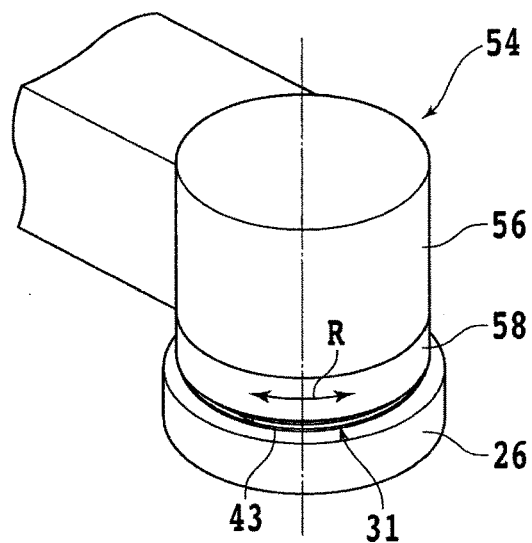

In this manner, the focal point of the laser beam is sequentially indexed to form a plurality of modified layers 45 and the cracks 47 extending from each modified layer 45 along the c-plane 21 inside the SiC substrate 31 over the whole area thereof. Thereafter, a separating step is performed in such a manner that an external force is applied to the SiC substrate 31 to thereby separate the SiC substrate 31 into two parts in a planar manner at the separation start point composed of the modified layers 45 and the cracks 47. This separating step is performed by using the pressing mechanism 54 shown in FIG. 1. The configuration of the pressing mechanism 54 is shown in FIGS. 12A and 12B. The pressing mechanism 54 includes a head 56 vertically movable by a moving mechanism (not shown) incorporated in the column 52 shown in FIG. 1 and a pressing member 58 rotatable in the direction shown by an arrow R in FIG. 12B with respect to the head 56.

As shown in FIG. 12A, the pressing mechanism 54 is relatively positioned above the SiC substrate 31 held on the chuck table 26. Thereafter, as shown in FIG. 12B, the head 56 is lowered until the pressing member 58 comes into pressure contact with the adhesive tape 41 attached to the upper surface 31a of the SiC substrate 31. In the condition where the pressing member 58 is in pressure contact with the adhesive tape 41 attached to the upper surface 31a of the SiC substrate 31, the pressing member 58 is rotated in the direction of the arrow R to thereby generate a torsional stress in the SiC substrate 31. As a result, the SiC substrate 31 is broken at the separation start point where the modified layers 45 and the cracks 47 are formed. Accordingly, as shown in FIG. 13, the SiC substrate 31 can be separated into an SiC substrate 31A held on the chuck table 26 and an SiC substrate 31B, wherein the support member 43 is attached to the SiC substrate 31A and the adhesive tape 41 is attached to the SiC substrate 31B.

While the SiC substrate 31 is separated into two parts in a planar manner by using the pressing mechanism 54 in this preferred embodiment, the SiC substrate 31 may be separated into two parts in a planar manner by pulling the adhesive tape 41 and the support member 43 in opposite directions, because the adhesive tape 41 is attached to the first surface (upper surface) 31a of the SiC substrate 31, the support member 43 is attached to the second surface (lower surface) 31b of the SiC substrate 31, and the separation start point composed of the modified layers 45 and the cracks 47 is formed inside the SiC substrate 31 over the whole area thereof.

Figure 13:
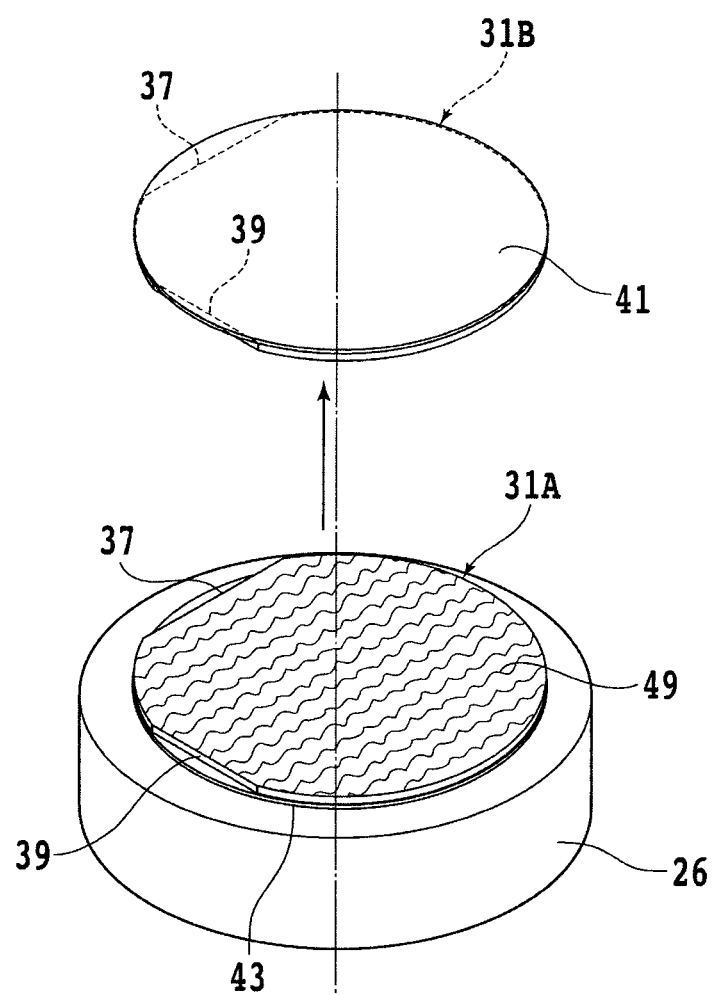
FIG. 13 is a perspective view showing a condition where the SiC substrate has been separated into a first SiC substrate having the adhesive tape and a second SiC substrate having the support member by performing the separating step.

As shown in FIG. 13, the SiC substrate 31A held on the chuck table 26 has a separation surface 49. The separation surface 49 is a slightly rough surface where the modified layers 45 and the cracks 47 are partially left. That is, microscopic asperities are formed on the separation surface 49. Accordingly, it is preferable to perform a flattening step of grinding the separation surface 49 of the SiC substrate 31A to thereby flatten the separation surface 49. Similarly, the other SiC substrate 31B has a separation surface (not shown). Accordingly, the separation surface of the SiC substrate 31B is also preferably ground to be flatten.

Figure 14:
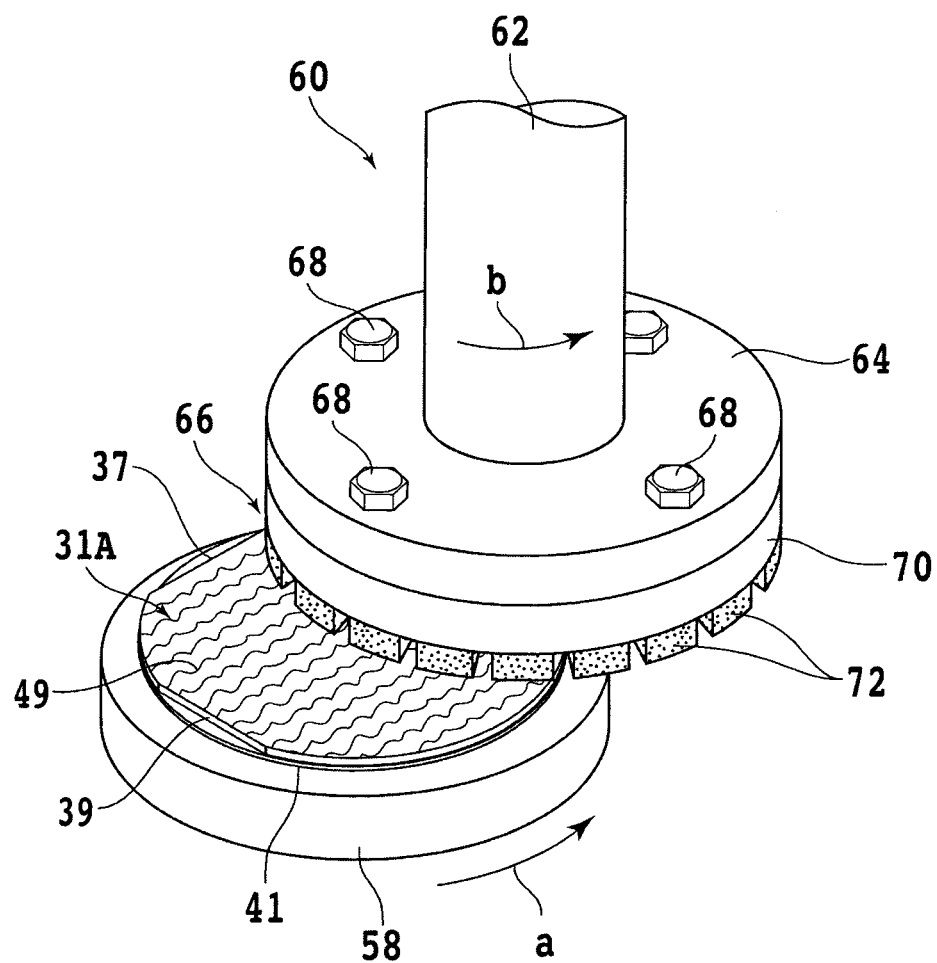
FIG. 14 is a perspective view showing a flattening step of flattening the upper surface of the second SiC substrate having the support member shown in FIG. 13.

This flattening step is performed by using a grinding apparatus including a chuck table 58 and a grinding unit 60 shown in FIG. 14. In performing the flattening step, the SiC substrate 31A is held under suction through the support member 43 on the chuck table 58 in the condition where the separation surface 49 is exposed upward as shown in FIG. 14. The grinding unit 60 includes a spindle 62 adapted to be rotationally driven by a motor (not shown), a wheel mount 64 fixed to the lower end of the spindle 62, and a grinding wheel 66 detachably mounted to the lower surface of the wheel mount 64 by a plurality of screws 68. The grinding wheel 66 is composed of an annular wheel base 70 and a plurality of abrasive members 72 fixed to the lower surface of the wheel base 70 so as to be arranged along the outer circumference thereof.

Figure 15:
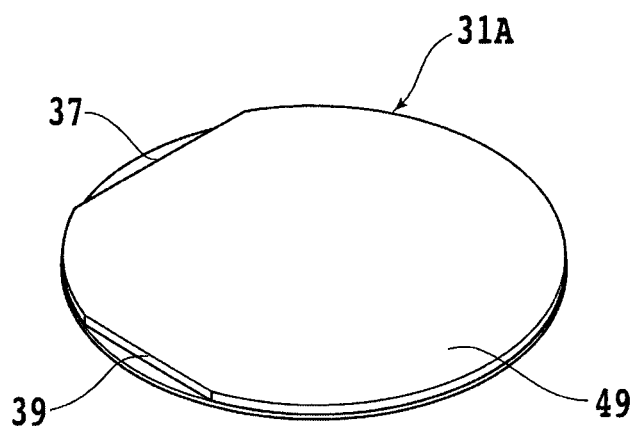
FIG. 15 is a perspective view of the second SiC substrate shown in FIG. 14 in the condition obtained by performing the flattening step.

In the flattening step, the chuck table 58 is rotated at 300 rpm, for example, in the direction shown by an arrow a in FIG. 14. At the same time, the grinding wheel 66 is rotated at 6000 rpm, for example, in the direction shown by an arrow b in FIG. 14. Further, a grinding unit feeding mechanism (not shown) is driven to lower the grinding unit 60 until the abrasive members 72 of the grinding wheel 66 come into contact with the separation surface 49 of the SiC substrate 31A held through the support member 43 on the chuck table 58. Then, the grinding wheel 66 is fed downward by a predetermined amount at a predetermined feed speed (e.g., 0.1 μm/second), thereby grinding the separation surface 49 of the SiC substrate 31A to flatten the separation surface 49. As a result, the modified layers 45 and the cracks 47 left on the separation surface 49 of the SiC substrate 31A can be removed to obtain a flat surface as shown in FIG. 15.

In the case of flattening the separation surface 49 of the SiC substrate 31A obtained by the separating step mentioned above, it is only necessary to slightly grind the separation surface 49 of the SiC substrate 31A by an amount of approximately 1 μm to 5 μm, so that the wear amount of the abrasive members 72 can be suppressed to approximately 4 μm to 25 μm. Further, the separation surface of the other SiC substrate 31B shown in FIG. 13 is similarly flattened by using the grinding apparatus mentioned above. More specifically, the SiC substrate 31B is held through the adhesive tape 41 on the chuck table 58 under suction in the condition where the separation surface of the SiC substrate 31B is exposed upward. In this condition, the separation surface of the SiC substrate 31B is ground by the grinding wheel 66 to thereby remove the modified layers 45 and the cracks 47 left on the separation surface of the SiC substrate 31B. Thus, the separation surface of the SiC substrate 31B can be flattened.

In the above preferred embodiment, the separation start point composed of the modified layers 45 and the cracks 47 is formed along the c-plane 21 in the SiC substrate 31. However, the SiC substrate separating method of the present invention is also applicable to the case that the separation start point composed of the modified layers 45 and the cracks 47 is not formed along the c-plane 21 as in Japanese Patent Laid-open No. 2013-49161, because the SiC substrate 31 is reinforced by the adhesive tape 41 and the support member 43 on the opposite sides.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. An SiC substrate separating method for separating an SiC substrate into at least two parts in a planar manner, said SiC substrate having a first surface, a second surface opposite to said first surface, a c-axis extending from said first surface to said second surface, and a c-plane perpendicular to said c-axis, said SiC substrate separating method comprising:

an adhesive tape attaching step of attaching a transparent adhesive tape to said first surface of said SiC substrate;

a support member attaching step of attaching a support member to said second surface of said SiC substrate;

a separation start point forming step of setting the focal point of a laser beam having a transmission wavelength to said SiC substrate and said adhesive tape inside said SiC substrate at a predetermined depth from said adhesive tape after performing said adhesive tape attaching step and said support member attaching step, and next applying said laser beam to said adhesive tape as relatively moving said focal point and said SiC substrate to thereby form a modified layer parallel to said first surface of said SiC substrate and cracks propagating from said modified layer, thus forming a separation start point; and a separating step of applying an external force to said SiC substrate after performing said separation start point forming step, thereby separating said SiC substrate into a first SiC substrate having said first surface and a second SiC substrate having said second surface at said separation start point in the condition where said adhesive tape is attached to said first SiC substrate and said support member is attached to said second SiC substrate;

said separation start point forming step including a modified layer forming step of relatively moving the focal point of said laser beam in a first direction perpendicular to a second direction where said c-axis is inclined by an off angle with respect to a normal to said first surface of said SiC substrate and said off angle is formed between said c-plane and said first surface, thereby linearly forming said modified layer extending in said first direction inside said SiC substrate, and an indexing step of relatively moving said focal point in said second direction to thereby index said focal point by a predetermined amount in said second direction.

2. The SiC substrate separating method according to claim 1, wherein the refractive index of said adhesive tape is higher than the refractive index of air and lower than the refractive index of said SiC substrate.

3. The SiC substrate separating method according to claim 1, further comprising a flattening step of grinding a separation surface of said first SiC substrate separated from said second SiC substrate at said separation start point and also grinding a separation surface of said second SiC substrate separated from said first SiC substrate at said separation start point, by using an abrasive member, thereby flattening said separation surface of said first SiC substrate and said separation surface of said second SiC substrate.

\* \* \* \* \*